United States Patent [19]
Sano

[11] Patent Number: 5,604,446
[45] Date of Patent: Feb. 18, 1997

[54] PROBE APPARATUS

[75] Inventor: Kunio Sano, Yamanashi-ken, Japan

[73] Assignees: Tokyo Electron Limited, Tokyo; Tokyo Electron Yamanashi Limited, Nirasaki, both of Japan

[21] Appl. No.: 512,915

[22] Filed: Aug. 9, 1995

[30] Foreign Application Priority Data

Sep. 9, 1994 [JP] Japan .................... 6-215870

[51] Int. Cl.⁶ .................... G01R 1/073; G01R 31/02
[52] U.S. Cl. .................... 324/758; 324/754
[58] Field of Search .................... 324/754, 757, 324/758, 158.1, 760

[56] References Cited

U.S. PATENT DOCUMENTS

| | | | |
|---|---|---|---|
| 3,970,934 | 7/1976 | Aksu | 324/754 |
| 4,636,722 | 1/1987 | Ardezzone | 324/754 |
| 4,912,400 | 3/1990 | Plante | 324/754 |
| 5,461,326 | 10/1995 | Woith et al. | 324/758 |

Primary Examiner—Ernest F. Karlsen
Attorney, Agent, or Firm—Oblon, Spivak, McClelland, Maier & Neustadt, P.C.

[57] ABSTRACT

The probe apparatus for a semiconductor wafer has a work table on which a wafer is placed. A printed wiring board having a high rigidity is situated above the work table. A flexible membrane probe card is detachably mounted on the printed wiring board. The probe card has a main region in which contact elements to be brought into contact with electrode pads of the semiconductor wafer are arranged. A rigid rectangular frame is attached to the rear surface of the probe card so as to flatten the probe card. An expandable chamber for bringing the contact elements of the main region into elastic contact with the electrode pads of the semiconductor wafer, is provided behind the main region of the probe card. A guide is arranged to surround the expandable chamber in tight contact therewith. A pushing plate having a hard base and elastic layers is arranged between the expandable chamber and the probe card. The main region is pushed out by the pushing plate in a state parallel to the wafer.

20 Claims, 4 Drawing Sheets

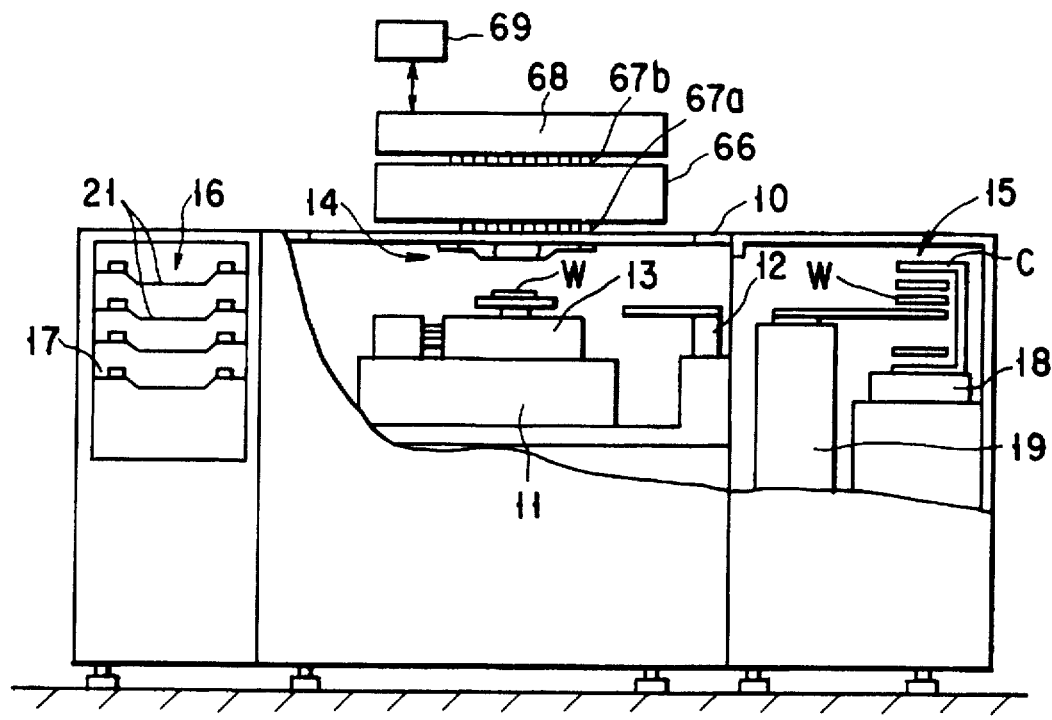
F I G. 1
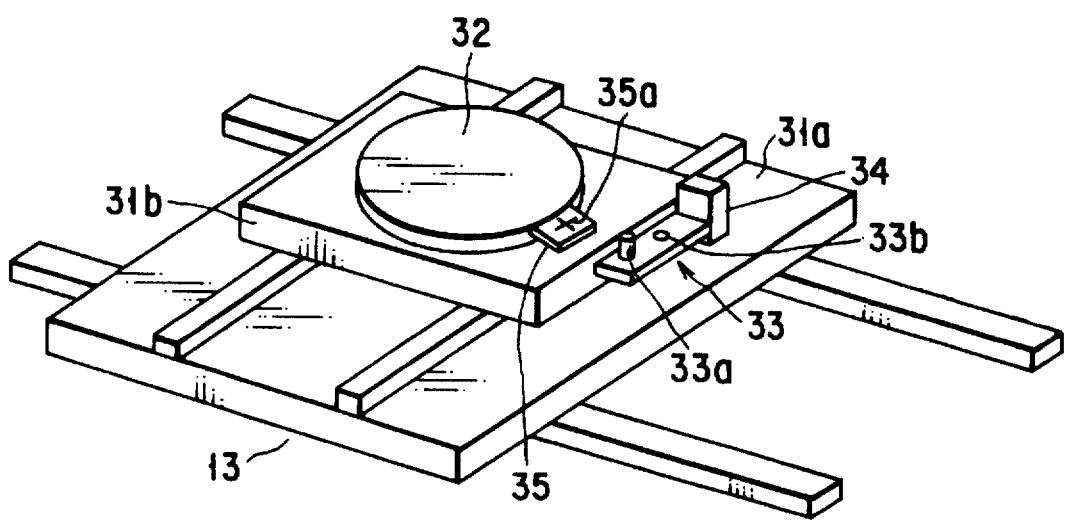
F I G. 2

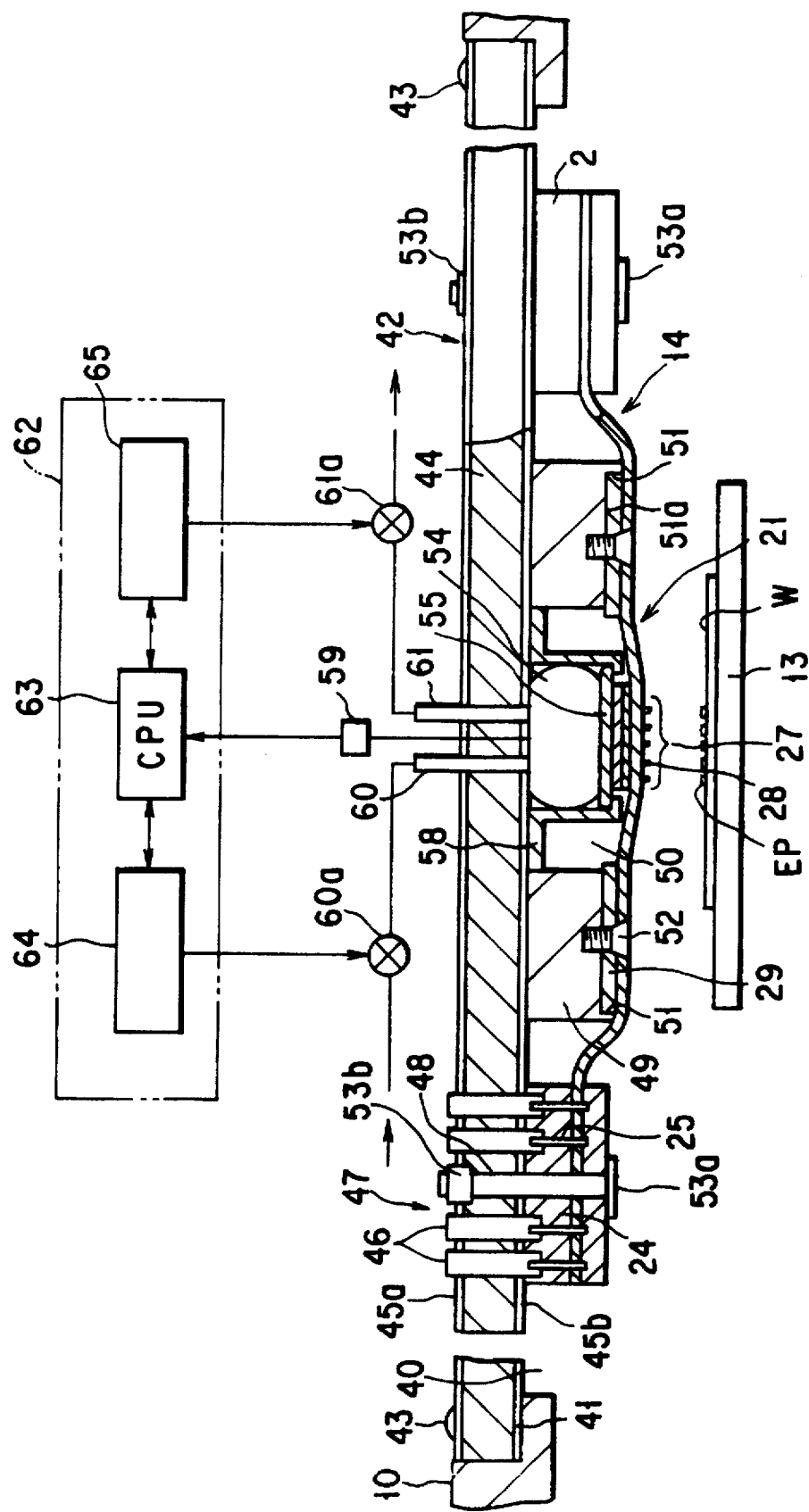
F I G. 3

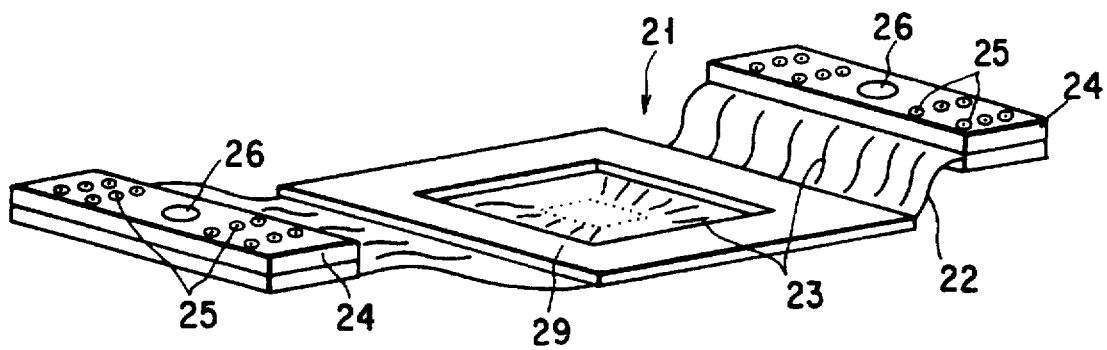
F I G. 4
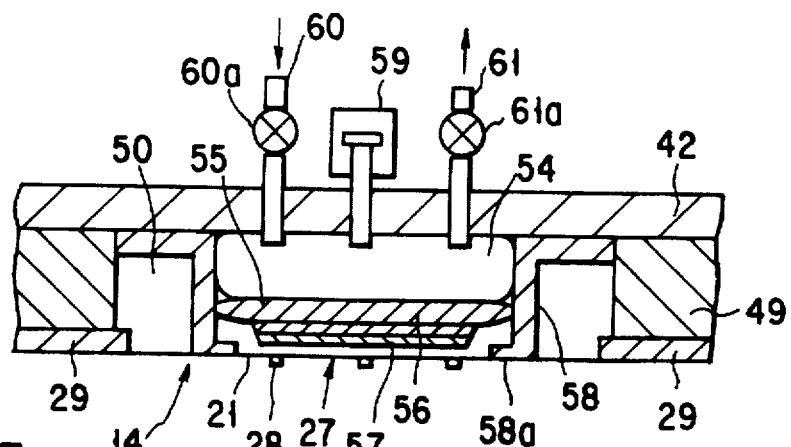
F I G. 5
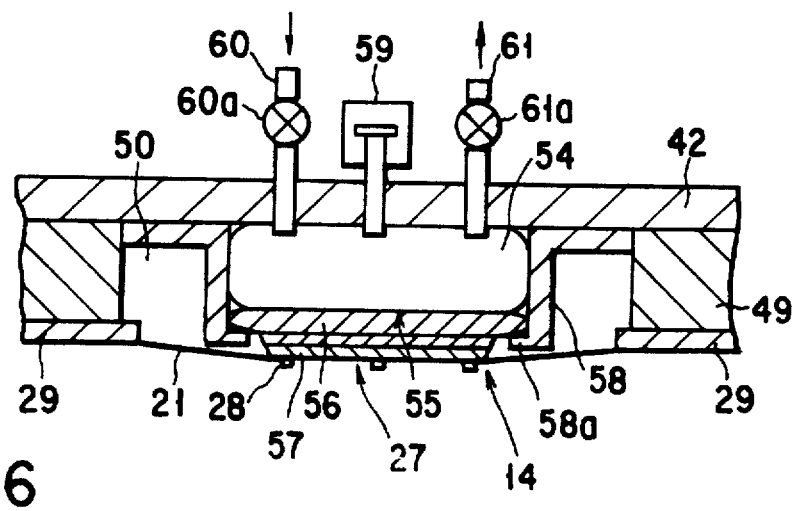
F I G. 6

5,604,446

PROBE APPARATUS

BACKGROUND OF THE INVENTION

1. Field of the Invention

The present invention relates to a probe apparatus for examining an electrical characteristic of an object such as a semiconductor device.

2. Description of the Related Art

As conventionally known, a large number of semiconductor devices are formed on a semiconductor wafer by using the precision photographic transfer technique or the like, and then the wafer is diced into the semiconductor devices. In such a manufacture process of semiconductor devices, the electrical characteristics of semi-finish semiconductor devices are examined while they are still in a semiconductor wafer by using a probe apparatus. Then, only those of the semi-finished semiconductor devices judged to be good in the examination are passed onto later steps including packaging, thereby increasing productivity.

A probe apparatus of this type includes a work table movable in the X-Y-Z-θ directions, on which an object is placed. A probe card having a number of probes each corresponding to each one of electrode pads of a semiconductor wafer as an object of examination, is fixedly situated above the work table. The semiconductor wafer is placed on the work table, and the work table is driven such as to bring each probe into contact with the respective electrode pad of the semiconductor wafer, thus performing an examination via each probe by using a tester.

Recently, in accordance with a further decrease in the size of semiconductor devices, the integration of circuits is greatly increased. Accordingly, the size of electrode pads is reduced, and the interval between adjacent electrode pads is narrowed. For example, each electrode pad of a semiconductor device has one side of 60 µm to 100 µm, and the distance between adjacent electrode pads in a row is 100 µm to 200 µm. Therefore, as mentioned above, it is technically very difficult to arrange a large number of, for example, several hundred probes within a limited space of a probe card, and the conventional arrangement of probes is now reaching its limit.

In consideration of this, a so-called membrane-type probe card, in which a number of electrode bumps are provided on a membrane having wiring of a predetermined pattern, is proposed as disclosed in Jap. Pat. Appln. KOKAI Publication No. 2-126159 or 2-16364.

The probe apparatus disclosed in Jap. Pat. Appln. KOKAI Publication No. 2-126159 has a membrane having a number of electrode bumps and adhered to a movable ring frame. The periphery portion of the membrane is supported by a support, and a plate spring is stretched between the support and the movable ring frame. A cushion is adhered to the rear surface of the membrane, and the difference in height between electrode pads of a wafer is absorbed by the cushion. During the examination, the membrane moves in the vertical direction integrally with the movable ring frame in spite of the spring force of the plate spring, and the electrode bumps are brought into elastic contact with the electrode pads.

The probe apparatus disclosed in Jap. Pat. Appln. KOKAI Publication No. 2-163664 has substantially the same structure as that of Publication No. 2-126159 except that a swingable plate is provided on the rear surface of the membrane. In this apparatus, the membrane and the wafer are gradually set parallel to each other and brought into elastic contact with each other as the swingable plate is rotated during the examination, when the wafer and the membrane have not been parallel with each other during the examination.

SUMMARY OF THE INVENTION

The object of the present invention is to provide a probe apparatus suitable for the examination of semiconductor devices having a high degree of integration, and capable of performing measurements by accurately bringing the contact electrodes in contact with the electrode pads of each device.

According to a first aspect of the present invention, there is provided a probe apparatus for examining an electrical characteristic of an object having a number of electrode pads, comprising: a work table having a table surface on which the object is placed; a wiring board provided above the work table, the wiring board comprising a substrate supported by a framework of the probe apparatus and having high rigidity, and board wiring provided on the substrate and electrically connected to a tester; a probe card supported by the wiring board, the probe card comprising a flexible and insulating membrane, and flexible card wiring formed on the membrane and electrically connected to the board wiring of the wiring board, the probe card having a main region, in which a plurality of contact elements to be respectively brought into contact with the electrode pads of the object are arranged, on a front side opposing to the table surface, and the contact elements being electrically connected to the card wiring; mounting means for mounting the probe card on the wiring board; an expandable chamber arranged behind the main region of the probe card, which expands and contracts as a fluid is supplied thereto or discharged therefrom, the expandable chamber pushing the main region of the probe card from its rear side so as to bring the contact elements of the main region into elastic contact with the electrode pads of the object when the expandable chamber expands; supplying means for supplying the fluid to the expandable chamber; discharging means for discharging the fluid from the expandable chamber; and a hard flat plate provided between the expandable chamber and the main region of the probe card, the flat plate having a contour within which all of the contact elements are located, and the flat plate being arranged so as to push the main region of the probe card from its rear side while substantially maintaining parallelism of the main region with respect to the table surface when the expandable chamber expands.

According to a second aspect of the present invention, there is provided a probe apparatus for examining an electrical characteristic of an object having a number of electrode pads, comprising: a work table having a table surface on which the object is placed; a wiring board provided above the work table, the wiring board comprising a substrate supported by a framework of the probe apparatus and having a high rigidity, and board wiring provided on the substrate and electrically connected to a tester; a probe card supported by the wiring board, the probe card comprising a flexible and insulating membrane, and flexible card wiring formed on the membrane and electrically connected to the board wiring of the wiring board, the probe card having a main region, in which a plurality of contact elements to be respectively brought into contact with the electrode pads of the object are arranged, on a front side opposing to the table surface, and the contact elements being electrically connected to the card wiring; mounting means for mounting the probe card on the wiring board; a frame having a high rigidity and attached to a rear side of the probe card such so as to surround the main region of the probe card, the frame having a flat surface for flattening a portion of the probe card, including the main region, surrounded by the frame; and an elastic member arranged behind the main region of the probe card, the elastic member pushing the main region of the probe card from its rear side so as to bring the contact elements of the main region into elastic contact with the electrode pads of the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram briefly showing the entire probe apparatus according to an embodiment of the present invention;

FIG. 2 is a perspective view showing the work table of the probe apparatus shown in FIG. 1;

FIG. 3 is a cross sectional view showing the probe mechanism of the probe apparatus shown in FIG. 1;

FIG. 4 is a perspective view showing a probe card of the probe apparatus shown in FIG. 1;

FIG. 5 is a cross sectional view showing the probe mechanism of the probe apparatus shown in FIG. 1 in a non-examination state;

FIG. 6 is a cross sectional view showing the probe mechanism of the probe apparatus shown in FIG. 1 in an examination state.

DESCRIPTION OF THE PREFERRED EMBODIMENTS

Figure 7:
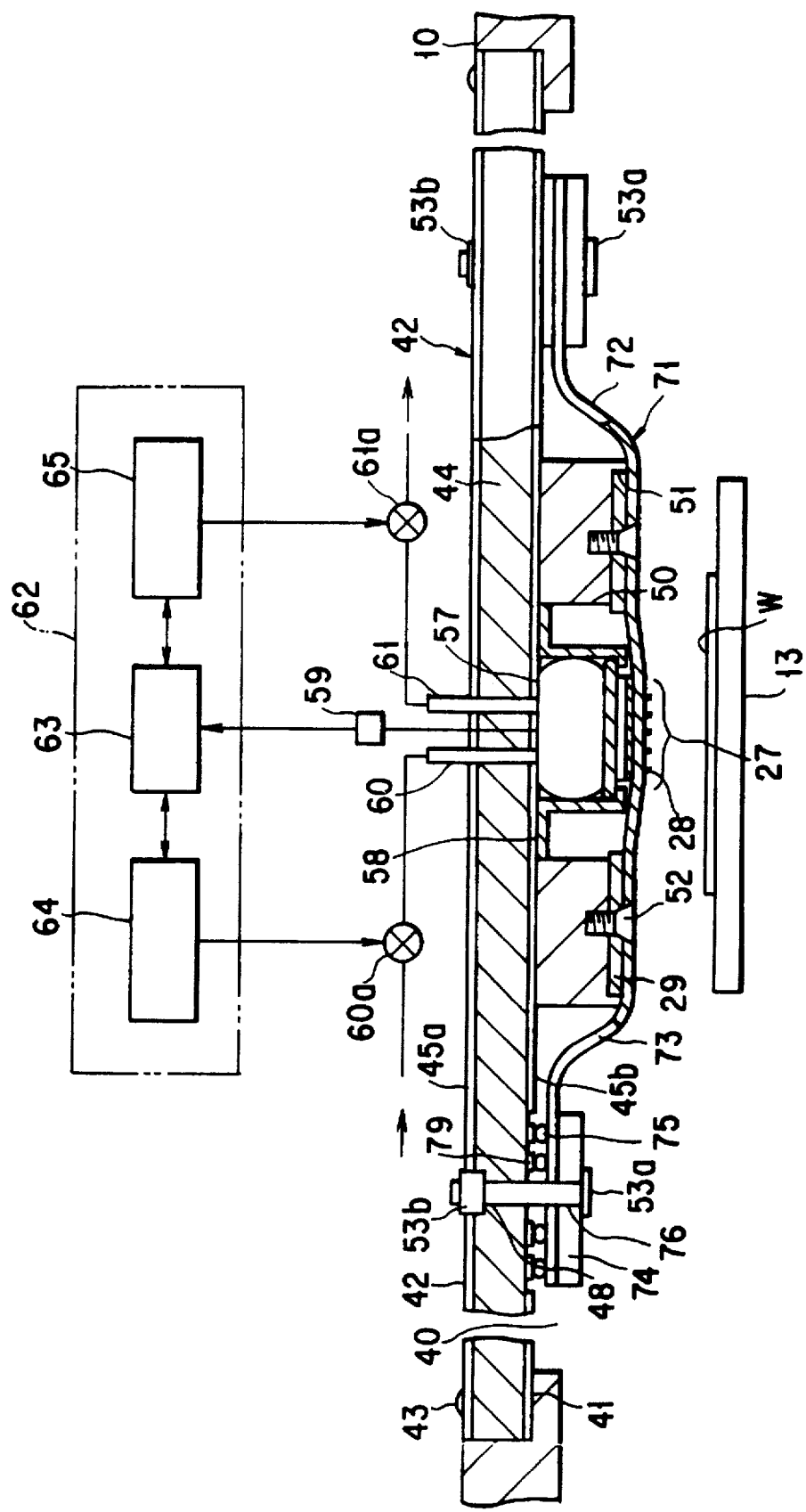
FIG. 7 is a cross sectional showing the probe mechanism of the probe apparatus according to another embodiment of the present invention.

As shown in FIG. 1, a main body 10 of a probe apparatus has a main stage 11 in its center. A work table 13 having a horizontal top surface is provided on the main stage 11, and an object to be examined such as a semiconductor wafer W is placed on the top surface. The main stage 11 can be moved along with the work table in the X and Y directions in a horizontal plane. A probe mechanism 14 is provided above the work stage 13. An alignment unit (not shown) is provided in the front side of the center of the main body 10. A camera serving as an image identifying device used for alignment is provided in the alignment unit. For the purpose of alignment, the work stage 13 is moved below the camera.

An autoloader 15 is provided on the right side of the main body 10. In the autoloader 15, a wafer cassette C containing a number of semiconductor wafers W arranged in a vertical direction at regular intervals, is replaceably placed on a cassette table 18. Provided between the wafer cassette C and the work table 13, are a loader stage 19 movable in the horizontal plane, and a wafer handling arm 12 driven by the Y directional driving mechanism and the Z direction elevating mechanism.

In order to examine a semiconductor wafer W using the probe apparatus, the wafer is conveyed close to the work table 13 by the loader stage 19, and then placed onto the work table 13 by the handling arm 12. After the examination, the wafer is transferred onto the loader stage 19 by the handling arm 12, and then conveyed to the wafer cassette C by the loader stage 19.

A probe card exchanger 16 is provided on the left side of the main body 10. In the probe card exchanger 16, different types of probe cards 21 are supported by card holders 17, and a number of cards are arranged therein in the vertical direction at regular intervals.

A contact ring 66 and a test head 68 are detachably arranged on the probe mechanism 14. The contact ring 66 has conductive pins 67a and 67b which project upward and downward, respectively. The contact ring 66 is electrically connected to a printed wiring board 42 of the probe mechanism 14 via the pins 67a, and to a test head 68 via the pins 67b. The test head 68 is connected to a tester 69. The tester 69 applies a predetermined power voltage and an examination pulse signal to a chip of the semiconductor wafer W, and receives an output signal from the chip. Based on the received output signal, the tester 69 judges whether or not the chip is defective.

Next, the work table 13 will be explained with reference to FIG. 2.

The work table 13 includes an Y stage 31a movable in the Y direction along two rails extending in the Y direction, and a X stage 31b movable on the Y stage 31a in the X direction along two rails extending in the X direction. The Y and X stages 31a and 31b are driven in the Y and X directions, respectively, in the horizontal plane by a generally-used driving mechanism which includes a pulse motor and the like. A chuck 32 mounted on the X stage 31b can be driven in the vertical direction (Z direction) by a known elevating mechanism, and rotated around the vertical center line which passes through the center of the X stage 31b, by a known rotation mechanism.

An elevating member 34 is fixed on a side surface of the X stage 31b. A camera 33 movable up and down is held on the elevating member 34. The movable camera 33 consists of a high-magnification system 33a and a low-magnification system 33b.

A small piece 35 is fixed on an side surface of the chuck 32 such that the small piece horizontally projects in its radial direction. The small piece 35 is formed of a rectangular transparent plate, on which a target 35a defined by the center of a cross drawn with a conductive thin film, for example, an ITO (indium tin oxide) or chrome thin film, is formed. The target 35a serves as a reference point for detecting positions in X, Y and Z directions by using the camera 33. Further, in the vicinity of the cross-shaped thin film, a conductive transparent thin film, for example, an ITO thin film, is provided to surround the cross-shaped thin film. The conductive transparent thin film is provided such that positions of a wafer W on the work table 13 with respect to the Z direction can be detected by an electrostatic capacity sensor (not shown).

The small piece 35 on which the target 35a is formed, can move onto the optical axis of the high-magnification system of the moving camera 33 as the chuck 32 rotates, and retreat therefrom. The small piece 35 may be detachably mounted on the chuck 32.

Next, the probe mechanism 14 will be described with reference to FIGS. 3 and 4.

An opening 40 is provided in an upper portion of the main body 10 such as to oppose to the main stage 11. The opening 40 is defined by the inner periphery of the step portion 41, and the printed wiring board 42 is fixed onto the step portion 41 by screws 43 so as to block up the opening 40.

The printed wiring board 42 includes a glass cloth epoxy resin substrate 44 having high rigidity and mechanical strength, and printed wiring 45a and 45b formed on the upper and lower surfaces of the substrate. Connector sections 47, in which a plurality of sockets 46 are arranged, are formed on the wiring board 42 in a horizontally symmetrical manner with respect to the center thereof. Further, a mounting hole 48 which is pierced through the wiring board 42 is formed in each connector section 47.

A support block 49 made of a hard synthetic resin material or a metal material is fixed onto the lower surface of the printed wiring board 42 located between the right and left connector sections 47, with screws or adhesive. The support block 49 is shaped into a thick rectangular frame, and an opening 50 having a rectangular shape as viewed from top is made at the center of the support block 49. The support block 49 has a step portion 51 which surrounds the opening 50, and the probe cards 21 are detachably mounted to the step portion with screws 52.

Each probe card 21 includes a rectangular membrane 22 made of a flexible and insulating material such as polyimide resin or silicone resin, and a flexible printed circuit (FPC) 23 formed of copper, copper alloy or the like, on the membrane. Connector sections 24 having a number of pins 25 connected to the print circuit 23 are provided on both ends of the membrane 22 in the longitudinal direction. Hard insulating resin plates having a through-hole 26 are adhered to each connector section 24.

A main region 27 in which a great number of contact elements 28 connected to the print circuit 23 and made of gold, gold-alloy or the like, is formed at the center of the lower surface of the membrane 22. The main region 27 is formed to have substantially the same size as that of one device of a semiconductor wafer W, that is, chip. The contact elements 28 are arranged such as to correspond to the electrode pads of the chip, and projects from the lower surface of the membrane 22.

A rectangular frame 29, made of a material such as an aluminum material and having a high rigidity, is adhered, as an integral unit, to that part of the upper surface of the membrane 22, which corresponds to the vicinity of the main region 27. The frame 29 is made flat and has a uniform thickness, thus giving a flatness to the main region 27 of the probe card 21 and the surrounding thereof. A probe card 21 is positioned with respect to the wiring board 42 as the frame 29 is fit into the step portion 51 of the lower surface of the support block 49. The probe card 21 is supported by the printed wiring board 42 as the frame 29 is fixed to the supporting block 49 with screws 52. The frame 29 may be positioned and fixed with respect to the support block 49 by vacuum suction or the like.

A surface 51a surrounded by the step portion 51 of the support block 49 is horizontal, and therefore the main region 27 of the probe card 21 and the periphery thereof, surrounded by the frame 29 are positioned parallel with the top surface of the work table 13 on which a wafer W is placed, in the state in which the frame 29 is fixed on the supporting block 49. Although the membrane 22 of the probe card 21 is made of flexible materials, and has a high flexibility overall, certain degrees of flatness and horizontal property are imparted to the membrane by the frame 29. Further, the stretch and sag of the membrane are suppressed so that the pitch of the contact elements 28 is maintained.

The connector sections 24 at both ends of the membrane 22 are aligned with the respective connector sections 47 of the printed wiring board 42, thus connecting the pins 25 to the sockets 46. Consequently, the printed wiring board 42 and the probe card 21 are electrically connected to each other. Further, screws 53a are inserted from below into the through-holes 26 of the connector sections 24 and the mount holes 48 of the printed wiring board 42, and the screws 53a are tightened by nuts 53b on the top side of the printed wiring board 42, thus fixing the connector sections 24 of the probe card 21 to the printed wiring board 42.

With the above operation, the probe card 21 is electrically and mechanically connected to the printed wiring board 42, and the middle portion of the probe card 21 projects slightly downward from the connector sections 24 due to the supporting block 49. It is important that the main region 27 of the probe card 21 is maintained parallel with the semiconductor wafer W placed on the work table 13. In the apparatus of this embodiment, the probe card 21 can be positioned with reference to the lower surface of the printed wiring board 42 due to the frame 29, and therefore the parallelism between the main region 27 and the semiconductor wafer W can be easily and accurately maintained.

An expandable chamber 54 is disposed in the opening 50 of the supporting block 49. The expandable chamber 54 is made of a flexible bag which can contain gas or liquid inside. A flat pushing plate 55 is adhered to the bottom surface of the expandable chamber 54. The pushing plate 55 has a base 56 made of a metal, synthetic resin material or the like, which is far more hard than the material of the expandable chamber 54. Adhered to the lower surface of the base 56, are two elastic layers 57 each made of an elastic material having a plan-view contour smaller than that of the lower surface. As the expandable chamber 54 inflates and contracts, the lower surface of the elastic layers 57 presses and releases, respectively, the rear surface of the main region 27 formed on the probe card 21.

The base 56 and the two elastic layers 57 each have a uniform thickness, and therefore the upper surface of the base 56 and the lower surface of the lower one of elastic layers 57 are arranged substantially parallel to each other. The lower surface of the elastic layers 57 has dimensions which cover the entire main region 27. In other words, all of the contact elements 28 arranged in the main region 27 are located within the plan-view contour of the base 56 and the plan-view contour of the elastic layers 57.

A cylindrical guide 58 for limiting an excessive expansion of the chamber 54 in the lateral direction is provided such as to surround the expandable chamber 54 including the pushing plate 55. Integrally formed at the lower end of the guide 58, is a stopper 58a for limiting a descending stroke of the expandable chamber 54 as the stopper abuts to the periphery portion of the base 56 extending sideward from the elastic layers 57. The lower surface of the stopper 58a is made flat, and placed such that the lower surface is situated substantially within the same plane as the lower surface of the frame 29 mounted on the supporting block 49.

When an amount of a fluid is supplied to apply pressure, the expandable chamber 54 inflates such that the top surface of the chamber 54 is brought into tight contact with the printed wiring board 42 and the bottom surface thereof is brought into tight contact with the rear surface of the probe card 21 via the pushing plate 55. During this period, the pushing plate 55 pushes the main region 27 of the probe card 21 in a direction parallel to the top surface of the work table 13, that is, parallel to the wafer W. On the contrary, when the fluid is discharged to reduce the internal pressure, the expandable chamber 54 contracts and the pushing plate 55 separates from the rear surface of the probe card 21.

A pressure sensor 59 is connected to the expandable chamber 54, and so are a flow-in tube 60 and a flow-out tube 61 which are connected to a fluid supply source (not shown). Electromagnetic valves 60a and 61a are provided respectively on the flow-in tube 60 and flow-out tube 61. The electromagnetic valves 60a and 61a are opened/closed by a control device 62 based on a pressure detection signal output from the pressure sensor 59, so as to control the pressure in the expandable chamber 54. For example, a CPU 63 for receiving a pressure detection signal from the pressure sensor 59, and mass flow controllers 64 and 65 for opening/closing the electro-magnetic valve 60a and 61a and for controlling the opening degree thereof in accordance with an output signal from the CPU, are provided in the control device 62.

Next, the operation of the probe apparatus will be described.

First, a semiconductor wafer W in a wafer cassette C is transferred by the loader stage 19 and the handling arm 12, and passed onto the work table 13 of the main stage 11. After the wafer W is fixed by the chuck 32 of the work table 13, the position of the chuck 32 is adjusted in the X, Y and θ directions, and the probe card 21 and the wafer W are positioned with each other in horizontal planes.

For example, 64 semiconductor chips are formed on one wafer W, and a main region 27 which corresponds to one semiconductor chip is provided for a probe card 21. Therefore, the position of the chuck 32 is adjusted in the X, Y and θ directions, and the main region 27 of the probe card 21 and one of the semiconductor chips of the wafer W are aligned with each other.

Next, the chuck 32 is moved in the Z direction, that is, ascended, so that electrode pads EP of the semiconductor chip face the contact elements 28 provided in the main region 27 of the probe card 21 via a slight gap of 0.1 to 1 mm. At this moment, the expandable 54 arranged behind the probe card 21 is in a reduced pressure state, and the pushing plate 55 is separated from the rear surface of the probe card 21 as shown in FIG. 5.

Next, as shown in FIG. 6, the expandable chamber 54 is inflated by supplying a predetermined amount of fluid thereinto, and thus the probe card 21 is elastically pressed from behind by the pushing plate 55, such that the main region 27 of the probe card 21 projects downward while maintaining the horizontal flatness of the main region. Consequently, the electrode pads EP of the semiconductor chip and the contact elements 28 provided in the main region 27 of the probe card 21 are brought into elastic contact with each other. Thus, the electrode pads EP of the semiconductor chip are electrically connected to the probe card 21 via the contact elements 28.

Consequently, the semiconductor wafer W becomes electrically connected to the tester 69 via the probe card 21 and test head 68. The test head 69 applies a predetermined voltage and an examination signal to the semiconductor chip of the wafer W and receives an output signal from the semiconductor chip so as to judge whether or not the chip is defective.

As in the embodiment shown in the figures, the probe card 21 is provided with the frame 29 having a rigidity, and the probe card 21 is set with respect to the printed wiring board 42 as a reference surface; therefore parallelism between the main region 27 and the wafer W can be obtained. The main region 27 of the probe card 21 is pressed from the rear surface side by the expandable chamber 54 via the flat pushing plate 55, thus maintaining the parallelism between the main region 27 and the wafer W. As a pressure force is applied to the main region 27 of the probe card 21, which has a flexibility, by the expandable chamber 54, and the elastic layers 57 are formed on the lower surface of the pushing plate 55, the contact elements 28 can be brought into elastic contact with the electrode pads of the wafer W. Consequently, the electrode pads EP and the contact elements 28 can be accurately brought into contact with each other regardless of some irregularity among the electrode pads of the wafer W.

The internal pressure of the expandable chamber 54 is detected by the pressure sensor 59 at all times, and a detection signal is transmitted to the CPU 63. Therefore, in the case where the internal pressure is lowered, an instruction signal for opening valve is out-put from the CPU 63 to the mass flow controller 64, and the electromagnetic valve 60a is opened by the mass flow controller 64. Thus, the fluid is supplied to the expandable chamber 54, increasing the internal pressure.

In the case where the internal pressure in the expandable chamber 54 is increased by some influence such as an increase in the surrounding temperature, an instruction signal for opening valve is output from the CPU 63 to the mass flow controller 65, and the electromagnetic valve 61a is opened by the mass flow controller 65. Thus, the fluid is supplied to the expandable chamber 54, increasing the internal pressure.

The expandable chamber 54 including the pushing plate 55 is surrounded by the guide 58, and the stopper 58a is provided at the lower end of the guide. Consequently, the electromagnetic valves 60a and 61a may be closed as the pushing plate 55 abuts against the stopper 58a, maintaining the inner pressure of the expandable chamber 54 constant. Further, the descending stroke of the expandable chamber 54 can be limited by the stopper 58a, and therefore breakage of the probe card 21 caused by excessive press can be prevented.

In the above embodiment, the connector sections 24 and the supporting block 49 are separately formed; however, the connector sections 24 may be formed as a part of the supporting block 49.

FIG. 7 is a cross sectional view showing the probe mechanism of a probe apparatus according to another embodiment of the present invention. In FIG. 7, the same structural elements as those of the probe mechanism shown in FIG. 3 are designated by the same reference numerals, and an explanation therefor will be omitted. A probe card 71 of this embodiment has a rectangular membrane 72 made of a flexible and insulating material and a flexible printed circuit (FPC) 73 formed on the membrane 72. Connector sections 74 having a number of electrode bumps or pads 75 is provided on both ends of the membrane 72 with respect to the longitudinal direction. The electrode pads 75 are electrically connected to the flexible printed circuit 73. A through-hole 76 is formed in the connector sections 74.

As in the case of the probe mechanism shown in FIG. 3, the main region 27 is provided in the intermediate portion of the layer 72 with respect to the longitudinal direction. A number of contact elements 28 are arranged on the main region 27 such that they project from the lower surface of the membrane 72 and are situated to correspond to the electrode pads of one chip of a semiconductor wafer W.

The electrode pads 75 provided at both ends of the membrane 72 are brought into contact with the respective electrode pads 79 provided on the printed wiring board 42, thus electrically connecting the printed wiring board 42 and the probe card 71. A screw 53a is inserted from the bottom side into the through-hole 76 each connector section 74 of the probe card 71 and a mounting hole 48 of the printed wiring board 42, and the screw 53a is tightened with a nut 53b on the top of the printed wiring board 42.

With the probe card 71, a complicated structure including the socket 46 and pins 25 used in the previous embodiment is not necessary in order to electrically connect the printed wiring board 42 with the probe card 71. Therefore, the structures of the printed wiring board 25 and the probe card 71 are simplified. Further, since sockets, which projects significantly from the lower surface of the printed wiring board 42, are not necessary, an interference with other elements can be prevented.

In both embodiments, the main region 27 of the probe card 21 or 71 is formed so as to correspond to one of, for example, 64 semiconductor chips provided in a semiconductor wafer W. However, the main region 27 may be formed so that a number of semiconductor chips can be measured at once, or all of, for example, 64 semiconductor chips can be measured at once.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus for examining an electrical characteristic of an object having a number of electrode pads, comprising:

a work table having a table surface on which said object is placed;

a wiring board provided above said work table, said wiring board comprising a substrate supported by a framework of said probe apparatus and having high rigidity, and board wiring provided on said substrate and electrically connected to a tester;

a probe card supported by said wiring board, said probe card comprising a flexible and insulating membrane, and flexible card wiring formed on said membrane and electrically connected to said board wiring of said wiring board, said probe card having a main region, in which a plurality of contact elements to be respectively brought into contact with said electrode pads of said object are arranged, on a front side opposing said table surface, and said contact elements being electrically connected to said card wiring;

mounting means for mounting said probe card on said wiring board;

an expandable chamber arranged behind said main region of said probe card, said expandable chamber expanding and contracting as a fluid is respectively supplied thereto and discharged therefrom, said expandable chamber pushing said main region of said probe card from a rear side thereof so as to bring said contact elements of said main region into elastic contact with said electrode pads of said object when said expandable chamber expands;

supplying means for supplying said fluid to said expandable chamber;

discharging means for discharging said fluid from said expandable chamber;

a hard flat plate provided between said expandable chamber and said main region of said probe card, said flat plate having a contour within which all of said contact elements are located;

a guide surrounding said expandable chamber and said flat plate; and a stop provided at an end portion of said guide and being contactable with and engagable with said flat plate when said expandable chamber expands, so as to define a movement stroke of said flat plate, and to cause said flat plate to push said main region of said probe card from a rear side thereof while substantially maintaining parallelism of said main region with respect to said table surface when said expandable chamber expands.

2. An apparatus according to claim 1, wherein said flat plate is attached to said expandable chamber.

3. An apparatus according to claim 1, which comprises an elastic layer provided on said flat plate, wherein said elastic layer is disposed between said flat plate and said main region of said probe card and has a contour within which all of said contact elements are located.

4. An apparatus according to claim 1, wherein said mounting means comprises a supporting block fixed to said wiring board, said supporting block having a recess in which said expandable chamber and said guide are arranged.

5. An apparatus according to claim 4, which comprises a frame having a high rigidity and attached to the rear side of said probe card so as to surround said main region of said probe card, wherein said frame has a flat surface flattening a portion of said probe card, including said main region, surrounded by said frame.

6. An apparatus according to claim 5, wherein said supporting block is pivoted, around said recess, with a positioning surface positioning said frame with respect to said wiring board such that said flat surface of said frame is substantially parallel with said table surface.

7. An apparatus according to claim 6, wherein said mounting means includes a member detachably fixing said frame to said positioning surface.

8. An apparatus according to claim 1, which comprises a pressure control member detecting a pressure in said expandable chamber and driving one of said fluid supply means and said discharge means, and also controlling the pressure in said expandable chamber.

9. An apparatus according to claim 1, wherein said guide is arranged in tight contact with said expandable chamber.

10. An apparatus according to claim 1, wherein said stopper is contactable with and engageable with a peripheral portion of said flat plate when said expandable chamber expands.

11. A probe apparatus for examining an electrical characteristic of an object having a number of electrode pads, comprising:

a work table having a table surface on which said object is placed;

a wiring board provided above said work table, said wiring board comprising a substrate supported by a framework of said probe apparatus and having high rigidity, and board wiring provided on said substrate and electrically connected to said tester;

a probe card supported by said wiring board, said probe card comprising a flexible and insulating membrane, and flexible card wiring formed on said membrane and electrically connected to said board wiring of said wiring board, said probe card having a main region, in which a plurality of contact elements to be respectively brought into contact with said electrode pads of said object are arranged, on a front side opposing said table surface, and said contact elements being electrically connected to said card wiring;

a mounding mechanism mounting said probe card on said wiring board;

an expandable chamber arranged behind said main region of said probe card, said expandable chamber expanding and contracting as a fluid is respectively supplied thereto and discharged therefrom, said expandable chamber pushing said main region of said probe card from a rear side thereof so as to bring said contact elements of said main region into elastic contact with said electrode pads of said object when said expandable chamber expands;

a supply mechanism supplying said fluid to said expandable chamber;

a discharging mechanism discharging said fluid from said expandable chamber;

a hard flat plate provided between said expandable chamber and said main region of said probe card, said flat plate having a contour within which all of said contact elements are located;

a guide surrounding said expandable chamber and said flat plate; and a stopper provided at an end portion of said guide and being contactable with and engagable with said flat plate when said expandable chamber expands, so as to define a movement stroke of said flat plate, and to cause said flat plate to push said main region of said probe card from a rear side thereof while simultaneously maintaining parallelism of said main region with respect to said table surface when said expandable chamber expands.

12. An apparatus according to claim 11, wherein said flat plate is attached to said expandable chamber.

13. An apparatus according to claim 11, which comprises an elastic layer provided on said flat plate, wherein said elastic layer is disposed between said flat plate and said main region of said probe card and has a contour within which all of said contact elements are located.

14. An apparatus according to claim 11, wherein said stopper is contactable with and engagable with a peripheral portion of said flat plate when said expandable chamber expands.

15. An apparatus according to claim 14, which comprises a frame having a high rigidity and attached to the rear side of the probe card so as to surround said main region of said probe card, wherein said frame has a flat surface flattening a portion of said probe card, including said main region, surrounded by said frame.

16. An apparatus according to claim 15, wherein said supporting block is pivoted, around said recess, with a positioning surface positioning said frame with respect to said wiring board such that said flat surface of said frame is substantially parallel with said table surface.

17. An apparatus according to claim 16, wherein said mounting mechanism includes a member detachably fixing said frame to said positioning surface.

18. An apparatus according to claim 11, which comprises a pressure control member detecting a pressure in said expandable chamber and driving one of said fluid supply mechanism and said discharge mechanism and controlling the pressure in said expandable chamber.

19. An apparatus according to claim 11, wherein said mounting mechanism comprises a supporting block fixed to said wiring board, said supporting block having a recess in which said expandable chamber and said guide are arranged.

20. An apparatus according to claim 11, wherein said guide is arranged in tight contact with said expandable chamber.

* * * * *